United States Patent [19]
Flint et al.

[11] Patent Number: 4,749,465
[45] Date of Patent: Jun. 7, 1988

[54] IN-LINE DISK SPUTTERING SYSTEM

[75] Inventors: Alan Flint, Los Gatos; Ken Miller, Mt. View; Sushil Shah, Sunnyvale, all of Calif.

[73] Assignee: Seagate Technology, Scotts Valley, Calif.

[21] Appl. No.: 826,758

[22] Filed: Feb. 6, 1986

Related U.S. Application Data

[62] Division of Ser. No. 732,878, May 9, 1985, abandoned.

[51] Int. Cl.⁴ .................. C23C 14/34; B65G 37/00
[52] U.S. Cl. .................. 204/298; 204/192.12; 198/465.1; 198/465.2; 414/217; 414/221
[58] Field of Search .................. 204/164, 298, 192.1, 204/192.15; 118/50, 719, 724, 729, 733; 414/217, 221; 198/465.1, 465.2, 465.3

[56] References Cited

U.S. PATENT DOCUMENTS

| | | | |
|---|---|---|---|
| 3,294,670 | 12/1966 | Charschan et al. | 204/298 |
| 3,521,765 | 7/1970 | Kauffman et al. | 204/298 |
| 3,584,847 | 6/1971 | Hammond et al. | 204/298 |
| 4,025,410 | 5/1977 | Stewart | 204/298 X |
| 4,274,936 | 6/1981 | Love | 204/298 X |
| 4,313,815 | 2/1982 | Graves, Jr. et al. | 204/298 |
| 4,379,743 | 4/1983 | Nakatsukasa et al. | 204/298 |
| 4,450,062 | 5/1984 | Macaulay | 204/298 |
| 4,485,911 | 12/1984 | Cameron | 198/465.1 X |
| 4,487,675 | 12/1984 | Meckel | 204/298 X |
| 4,500,407 | 2/1985 | Boys et al. | 204/298 |
| 4,500,409 | 2/1985 | Boys et al. | 204/298 |
| 4,558,388 | 12/1985 | Graves, Jr. | 204/298 X |

OTHER PUBLICATIONS

Varian Model MDP 1000, pp. 111-116, 3/85, Vac. Technology.
Gartek Model VXM8, Vertical Disk Coater.
Circuit Processing Apparatus Model V2000, Circuits Processing Apparatus, Inc.
Leybold-Heraeus Model ZV 1200, p. 41, 9/84, Solid State Technology.
Torr-Vac Model 4000, Specification #1051, by Torr-Vac.

Primary Examiner—John F. Niebling
Assistant Examiner—Nam X. Nguyen
Attorney, Agent, or Firm—Limbach, Limbach & Sutton

[57] ABSTRACT

A step-dwell transport apparatus and method for use in an in-line controlled environment processing system is disclosed. The transport apparatus employs a plurality of shuttles arranged in series along two parallel rails. Each shuttle carries one or more planar objects through a process chamber, which contains several in-line processing stations. One of the rails guides a queue of abutting shuttles through the process chamber, while the other rail serves as a return path for another queue of abutting shuttles. The shuttles move along each rail, with locomotion along the rail being provided by a pneumatic cylinder and linkage that periodically pushes forward the trailing shuttle in the queue. Transfer mechanisms are provided at each end of the apparatus to transfer individual shuttles from the end of one rail to the beginning of the other rail. Shuttles are supplied to and withdrawn from the process chamber one at a time through in-line air locks.

24 Claims, 8 Drawing Sheets

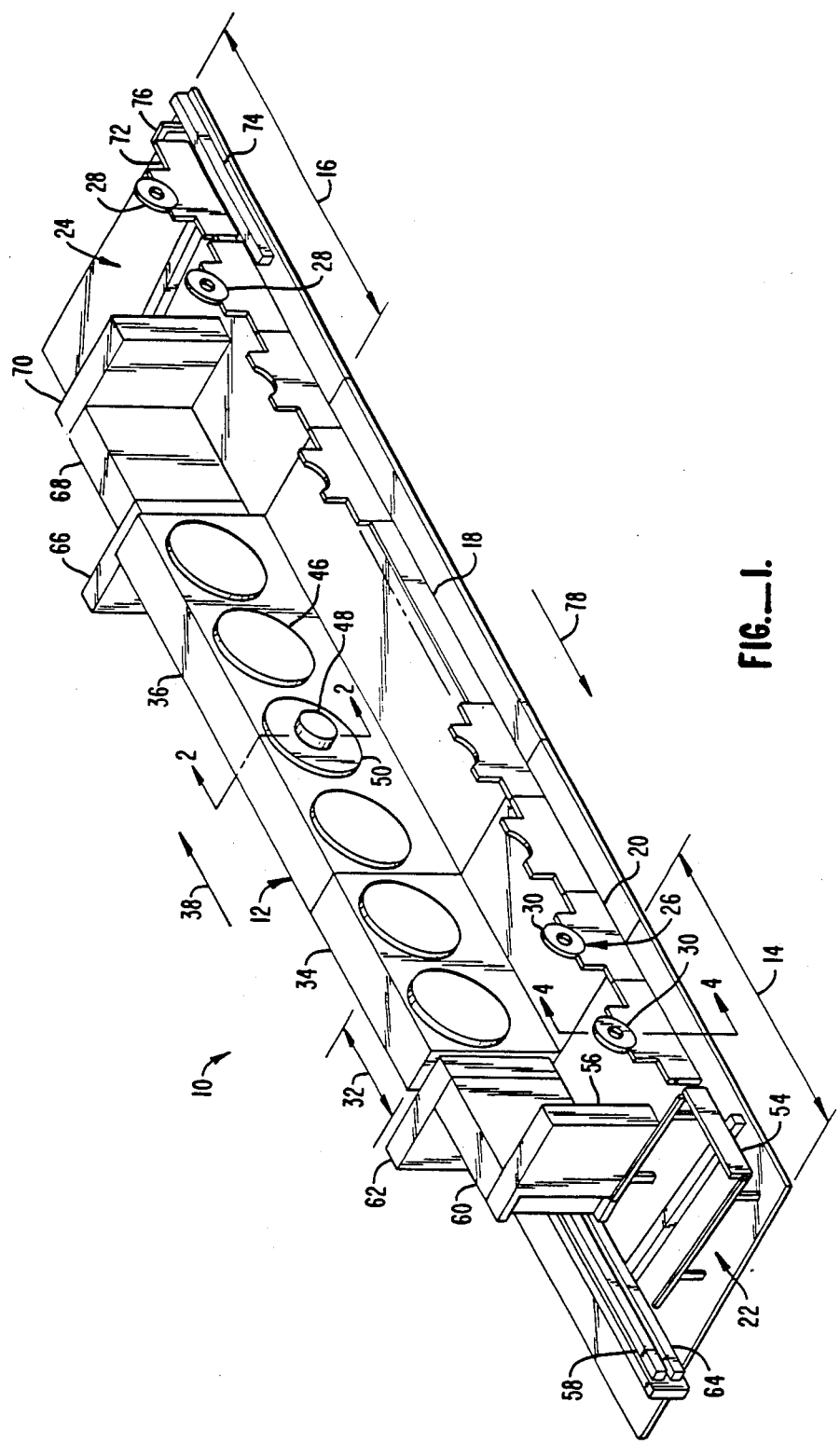
FIG.—1.

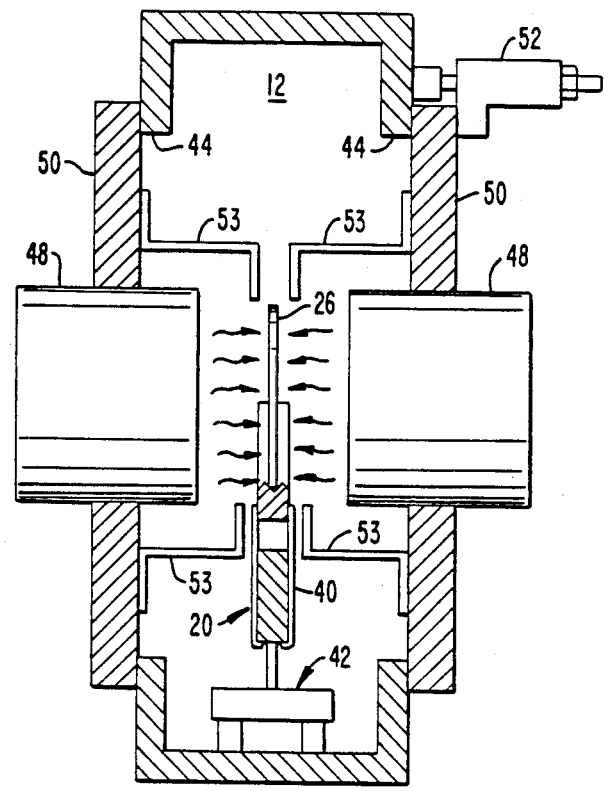
FIG._2.
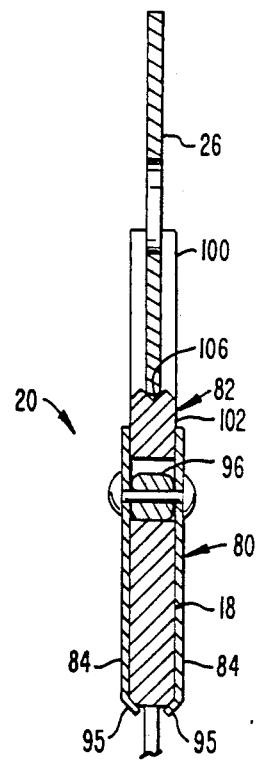
FIG._4.
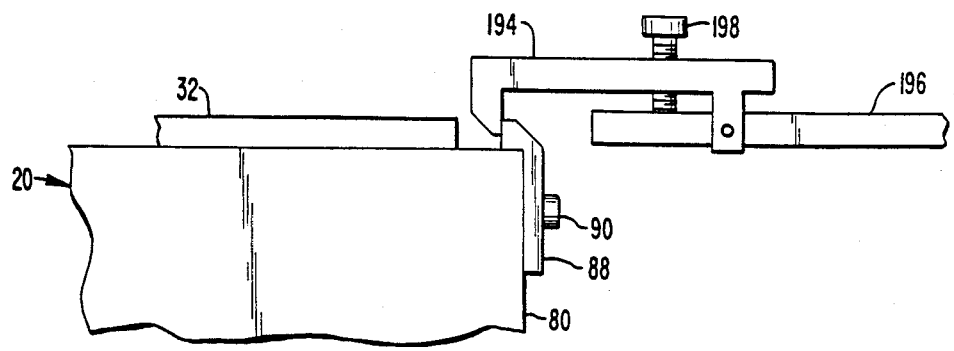
FIG._9.

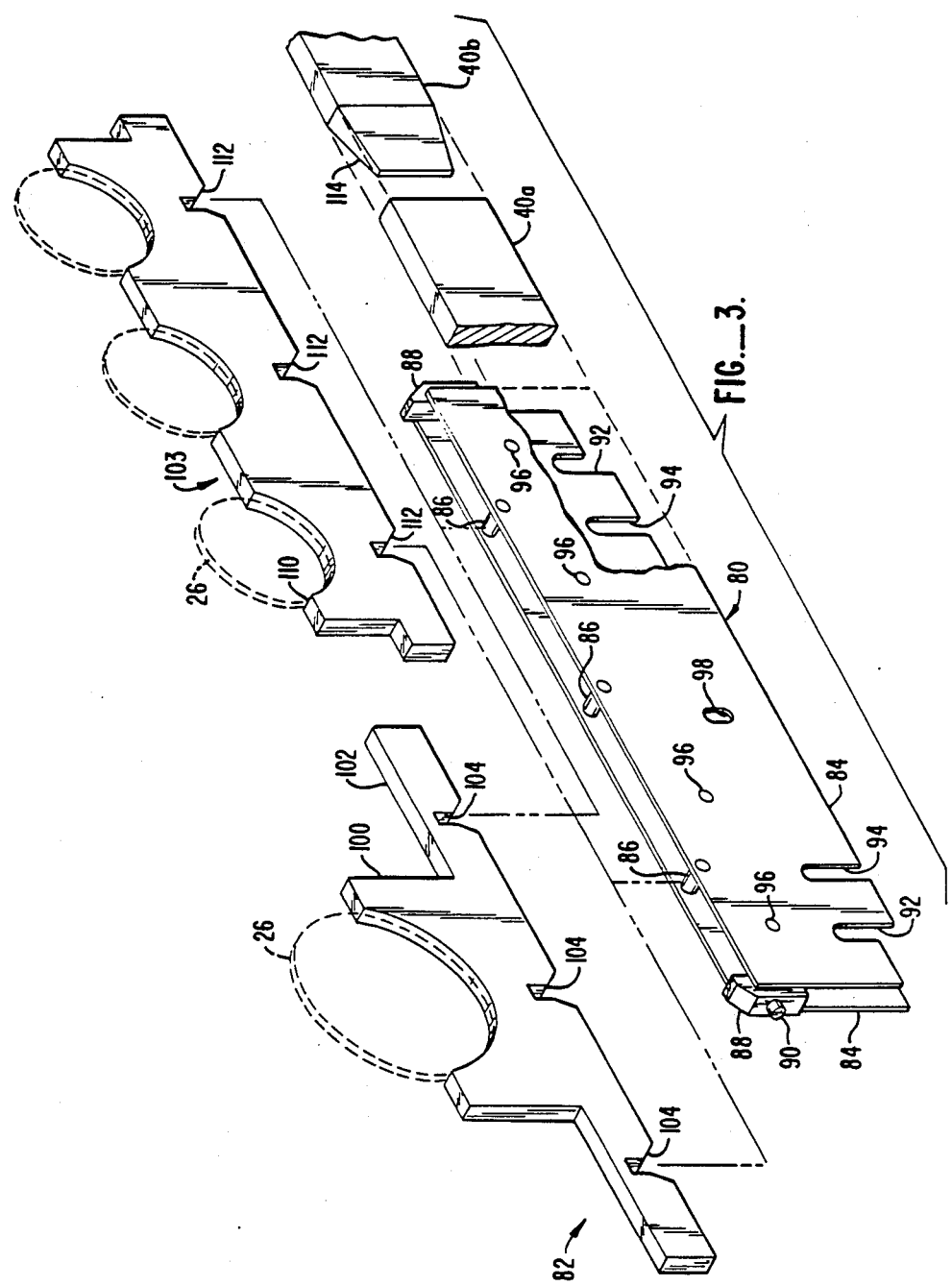
FIG._3.

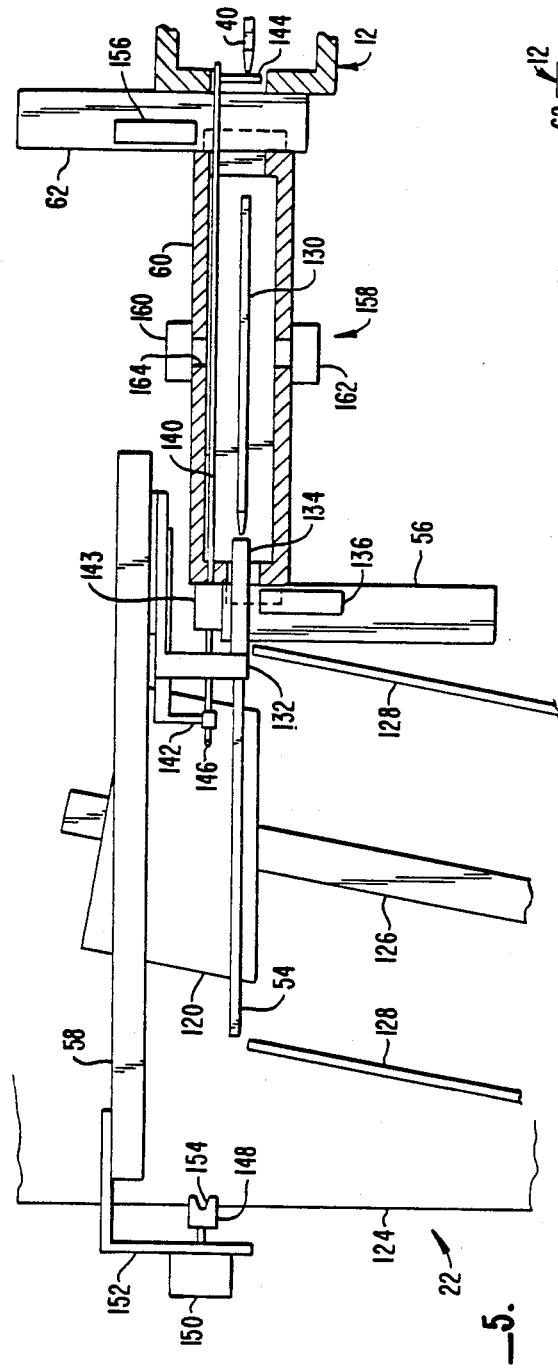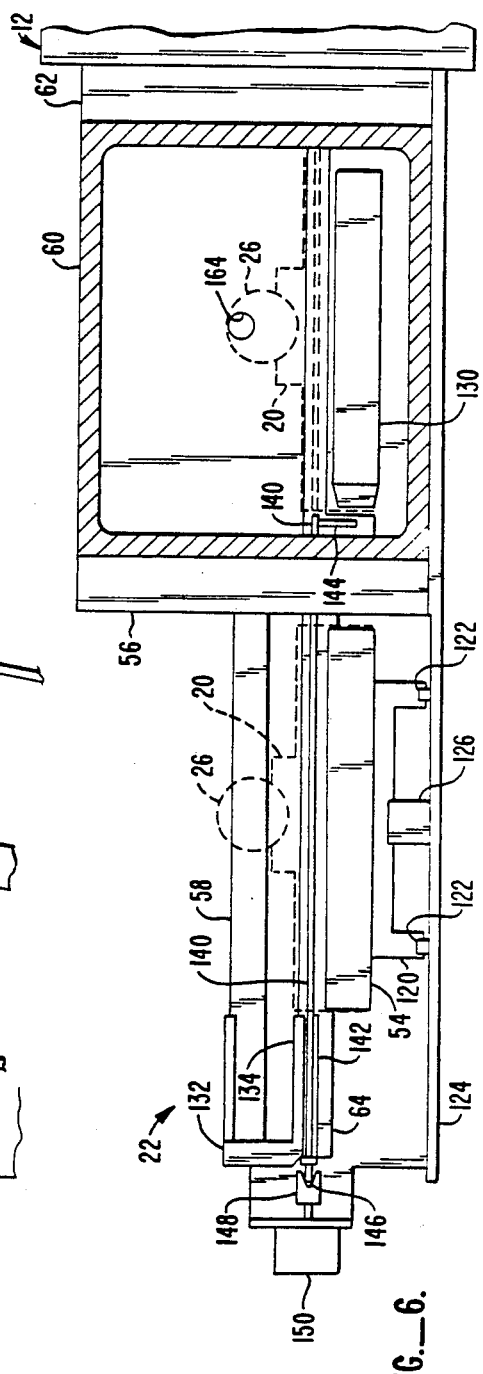

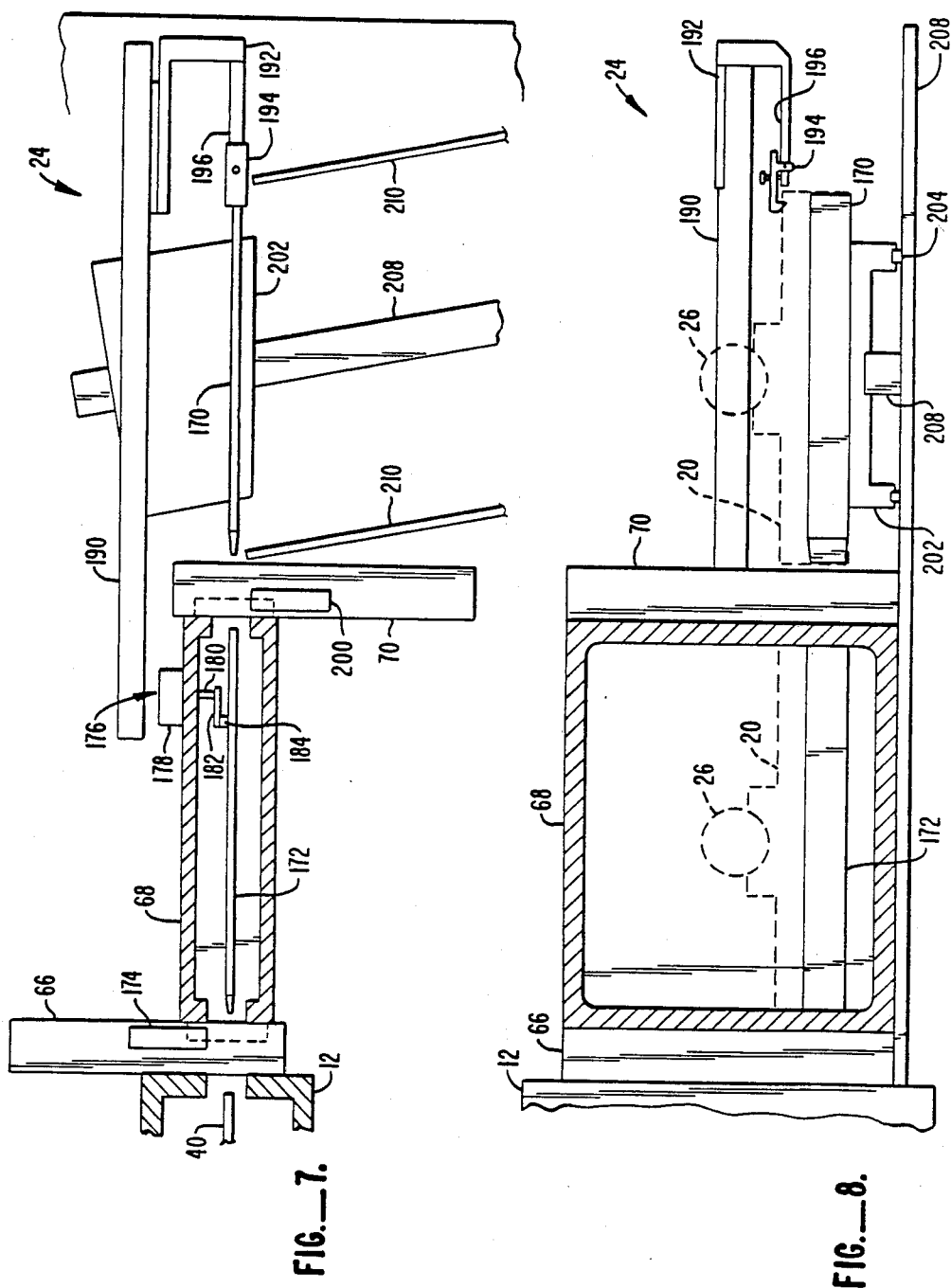

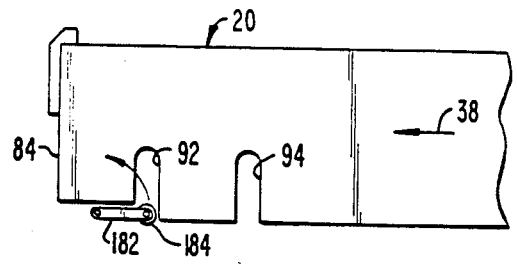
FIG._10A.
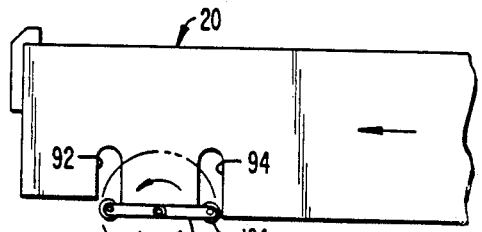
FIG._10B.
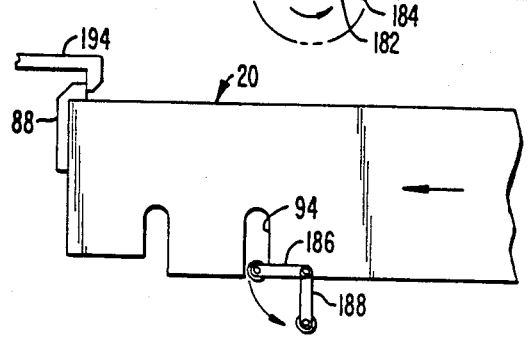
FIG._10C.
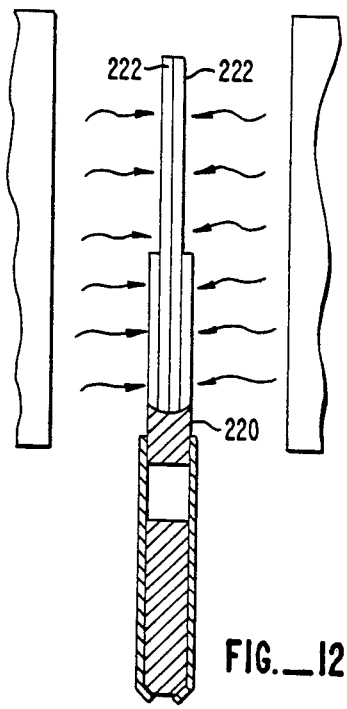
FIG._12.

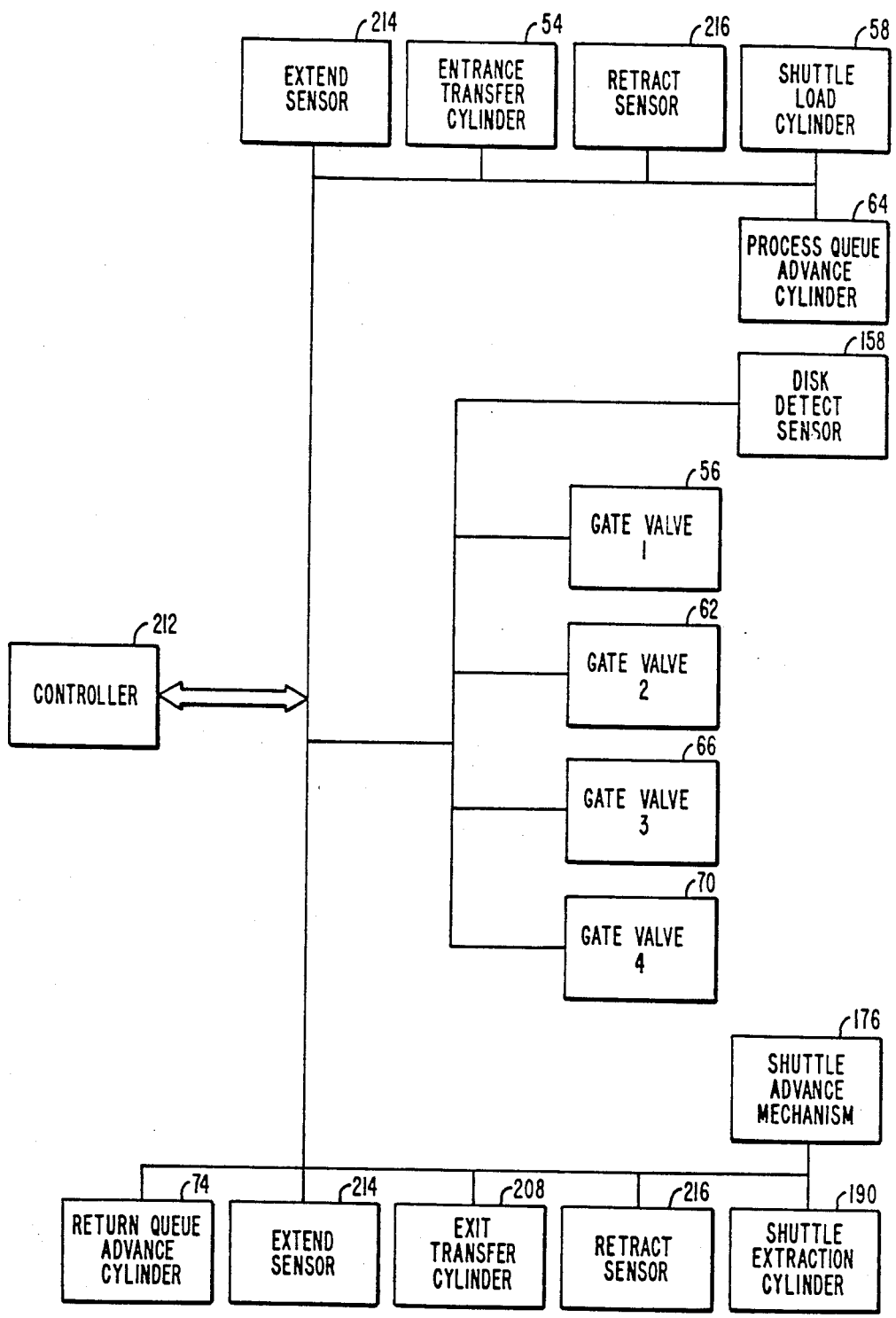
FIG._11.

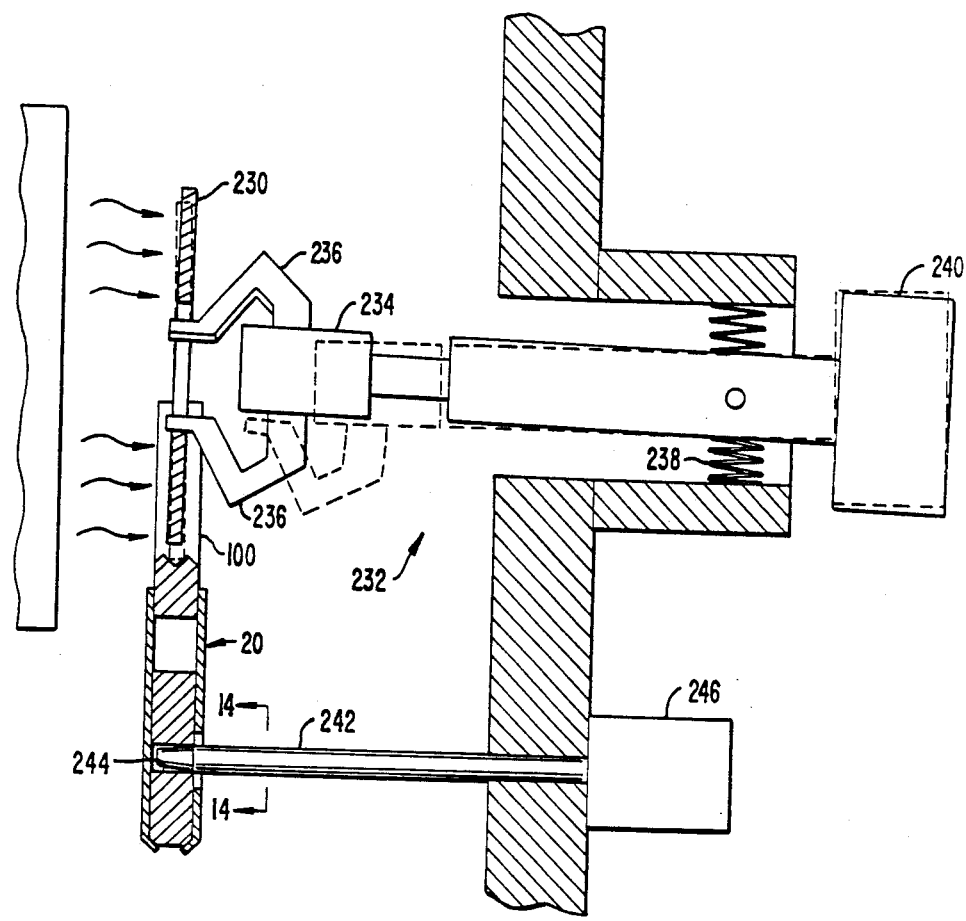
FIG._13.
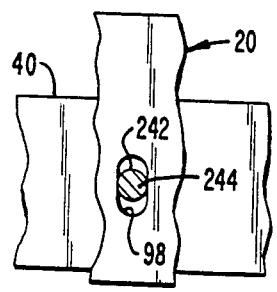
FIG._14.

IN-LINE DISK SPUTTERING SYSTEM

This is a division of application Ser. No. 732,878 filed May 9, 1985, now abandoned.

BACKGROUND OF THE INVENTION

1. Field of the Invention

This invention relates generally to object transport apparatus, and relates more particularly to a step-dwell transport apparatus and method for use in an in-line sputtering system.

2. Description of the Relevant Art

Sputtering is a process that is used for depositing material coatings onto objects. Sputtering may be used, for example, to apply optical coatings, to deposit metallization layers on semiconductors, to coat chrome masks, to coat flat panel displays, and to apply magnetic coatings to memory disks. The sputtering action can be reversed to etch away material from the surface of objects. Sputtering operations are typically carried out in an argon environment at reduced pressure, which necessitates the use of a process chamber sealed from the atmosphere and the use of air locks or other provisions for loading objects into and unloading objects from the process chamber. To obtain high quality coatings, it is essential that particulates and other contaminants be eliminated from the process chamber.

In the prior art, there are two general types of sputtering systems used for sputtering magnetic coatings onto memory disks: (1) those using a circular sputtering source with the disk or disks being held stationary during sputtering, and (2) those that continuously transport a disk or disks past a stationary strip source.

The concept of sputtering stationary disks is utilized in a disk sputtering system built by Varian of Santa Clara, Calif. Varian's MDP 1000 provides several separate process chambers for sputtering operations and a walking beam mechanism for transporting the disks through the system. The walking beam mechanism operates in conjunction with pedestals that are associated with each process chamber. The walking beam picks up an entire line of disks and advances the disks one station forward to the next pedestal. After such an advance, each pedestal raises its disk into the process chamber and seals the process chamber. When the process operation is complete, the pedestal is lowered and the walking beam mechanism transports the disk to the next pedestal. One significant drawback to such a complex transport mechanism is that particulates are more likely to be generated than with a simpler mechanism. Another drawback is that the system is difficult to expand to accommodate additional processing stations due to the complexity of the transport mechanism. Further, any disk that happens to fall off a pedestal or the walking beam is likely to jam the mechanism.

A sputtering system built by Gartek of Sunnyvale, Calif. also incorporated the concept of sputtering to stationary disks. The Gartek system included a U-shaped channel extending through an in-line process chamber containing several processing stations. Disks were conveyed through the process chamber by a queue of abutting carriers that slid in the U-shaped channel. Each carrier included a square rod that fit into the U-shaped channel, and included arms extending upward that retained a disk. Five carriers were loaded into an entrance chamber at the start of a batch run. After the entrance chamber was pumped down, a carrier was pushed into the process chamber, which pushed other carriers ahead to the next processing stations and pushed the leading carrier into an exit chamber. While the carriers were stationary, the processing operations were performed. After the five carriers had been transferred into the process chamber, two gate valves closed to isolate the process chamber from the entrance and exit chambers. The entrance and exit chambers were then vented to atmosphere, and processed disks were unloaded from carriers in the exit chamber and more unprocessed disks were placed on carriers and loaded into the entrance chamber. The batch mode operation was one significant drawback of the Gartek system, due to the time required to load and unload the entrance and exit chambers, and also due to inconsistent sputtering performance caused by the interruptions of loading and unloading. Another significant drawback was the tendency of the U-shaped channel to collect sputtered particles, which were flaked off by the carriers and contaminated the process chamber, and which caused the carriers to seize in the channel.

Several presently available sputtering systems continuously transport disks past a stationary sputtering source, including those made by Circuits Processing Apparatus of Fremont, Calif., Leybold-Heraeus of the Federal Republic of Germany, and TorrVac of Simi Valley, Calif. These systems orient the disks vertically on pallets, which are separately conveyed through a process chamber containing one or more in-line processing stations. Material is sputtered onto the disks as the pallets are continuously moved past stationary sputtering sources. Some such sputtering systems operate on a batch mode basis, wherein each process cycle consists of loading several pallets into an entrance air lock, processing each pallet and storing processed pallets in an exit air lock, and then unloading the exit air lock after all of the pallets have been processed. Since operation in batch mode involves a substantial amount of down time while the air locks are loaded and unloaded, other sputtering systems provide for pass through air locks that automatically load and unload single pallets into and from the process chamber, plus an automatic pallet return system that returns pallets from the exit side of the system to the entrance side. The transport mechanisms utilized in continuous type sputtering systems are typically chain or gear driven conveyors that tend to generate particulates within the process chamber. Another source of particulates are the top guide rollers that are typically used to guide and support the upper portions of the pallets.

Aside from particulate generation by the transport mechanisms, continuous sputtering systems have a more fundamental problem, that of magnetic layer modulation. A memory disk with a sputtered magnetic layer is used in a disk drive to magnetically store digital data in concentric tracks. If the strength of a data signal recorded on a track is modulated, i.e., varies cyclically as the disk is rotated, then the data content of the data signal is much more difficult to detect accurately. Magnetic layers applied by a continuous sputtering process tend to modulate the signal strength of data signals due to both variations in the layer thickness and skewed magnetic particle orientation. If the strip source used for sputtering the magnetic layer has any irregularities across its length that cause increased or decreased deposition rates, then a chord of increased or decreased layer thickness will be formed on the disk. When the disk is rotated, this chord will pass under the magnetic pick-up twice during each revolution, thereby modulating the magnetic signal. Additionally, magnetic particle orientation contributes to signal modulation. The orientation of the magnetic particles is radially skewed because particles sputtered by the strip source first contact the surface of the disk before the surface is normal to the strip source, which orients the magnetic particles toward the direction of pallet travel. When such a disk is rotated, the orientation of the magnetic particles continuously changes with respect to the magnetic pick-up, and thus contributes to signal modulation.

SUMMARY OF THE INVENTION

In accordance with the illustrated preferred embodiment, the present invention provides a step-dwell transport apparatus and method for use in an in-line vacuum environment processing system. More particularly, the present invention provides a transport apparatus for intermittently conveying planar objects such as disks past one or more processing stations each capable of performing a processing operation upon the planar objects. The present invention includes a rail that extends past each of the processing stations, several abutting shuttles arranged in a queue on the rail, with each shuttle being capable of movement along the rail to sequentially position a planar object adjacent to each of the processing stations and each shuttle substantially enclosing the rail to prevent particulate accumulation on the rail, and means for periodically advancing the queue of abutting shuttles along the rail by advancing a trailing one of the shuttles.

In addition, the present invention provides a method of performing a sequence of processing operations upon planar objects, including the steps of: loading the planar objects to be processed onto shuttles that are capable of sequentially positioning the planar objects adjacent to each of one or more processing stations within a process chamber; positioning a shuttle at a trailing position in a first queue of abutting shuttles that extends through the process chamber; periodically advancing the trailing shuttle to advance the first queue of abutting shuttles to the next sequential processing stations and to eject a leading shuttle of the first queue from the process chamber; performing the processing operations on the planar objects that are positioned adjacent to the processing stations while the first queue of abutting shuttles is stationary; repositioning the leading shuttle of the first queue to a trailing position in a second queue after the shuttle has been ejected from the process chamber; periodically advancing the second queue by advancing the trailing shuttle thereof; unloading the processed planar objects from the shuttles in the second queue; and continuously recycling the shuttles through the first and second queues.

The preferred embodiment of the present invention includes a transport apparatus that employs a plurality of shuttles arranged in series along two parallel rails. Each shuttle carries one or more disks or other planar objects through the process chamber, which contains several in-line pairs of processing stations. One of the rails, a process rail, guides a first queue of abutting shuttles through the process chamber, while the other rail, a return rail, serves as a return or recycling path for a second queue of abutting shuttles. The shuttles move along each rail, with locomotion along the rail being provided by a pneumatic cylinder and linkage that periodically pushes forward the trailing shuttle in the queue. Transfer mechanisms are provided at each end of the apparatus to transfer individual shuttles from the end of one rail to the beginning of the other rail. Shuttles are supplied to and withdrawn from the process chamber one at a time in line with the process rail through air locks. The air locks are designed to minimize the volume of gas that must be evacuated or vented in order to speed the operation of the processing system.

In operation, disks or other objects to be coated are placed on shuttles near the end of the return rail. An advance of the return queue of shuttles pushes one shuttle onto an entrance transfer rail that is aligned with the return rail. The entrance transfer rail then moves laterally to place the shuttle in line with the process rail. Then, a gate valve to the entrance air lock is opened and the shuttle is pushed into the entrance air lock, and the entrance transfer rail returns to its position in line with the return rail to await another shuttle. The gate valve then closes and the air lock is pumped down to achieve a vacuum. After the proper vacuum is obtained, another gate valve opens to connect the air lock to the process chamber, and the shuttle is pushed onto the process rail and to a processing station within the process chamber. Pushing this trailing shuttle into the process chamber also pushes the other shuttles on the process rail forward by a distance equal to the length of the shuttle to the next processing stations, and ejects the leading shuttle into an exit air lock. While the shuttles are stationary within the process chamber, the processing operations are performed. Each disk is oriented vertically on its shuttle to allow sputtering or other processing operations to be simultaneously performed on both surfaces of the disk. Thus, the action of the transport mechanism is a step-dwell action wherein each step advances the process queue of shuttles by one station, and each dwell holds the shuttles stationary during the performance of the sputtering or other processing operations. By the time the shuttle has passed through the preferred process chamber, it has had successive undercoat layers, a magnetic layer, and overcoat layers sputtered onto both surfaces of the disk. After the leading shuttle of the process queue is pushed into the exit air lock, a geneva crank mechanism advances the ejected shuttle to clear and allow a gate valve to close in order to isolate the exit air lock from the process chamber. The exit air lock is then vented to atmosphere and the shuttle is moved to an exit transfer rail that is aligned with the process rail. The exit transfer rail then moves laterally to place the shuttle in line with the return rail. When both transfer rails are aligned with the return rail, the shuttle is pushed from the exit transfer rail and onto the return rail, which in turn pushes a leading shuttle from the leading end of the return queue onto the entrance transfer rail for subsequent loading into the process chamber. While on the return rail, the now processed disk is removed from the shuttle and another disk to be processed is loaded onto the shuttle.

Key features of the present invention include the minimization of particulates generated within the process chamber due to the simplicity and placement of the transport apparatus, the use of circular sputtering sources to sputter to stationary disks or other objects to be coated, the continuous throughput of disks through the process chamber, the continuous recycling of shuttles through the processing system, the use of minimized volume air locks in line with the process rail, the ability to accommodate different sized disks and other planar objects, the ability to add additional processing stations to expand the number of processing operations, the ability to rotate the disks during sputtering, and the flexibility to accommodate processing operations other than sputtering.

The features and advantage described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF THE DRAWINGS

FIG. 1 is an overall perspective view of an inline disk sputtering system according to the preferred embodiment of the present invention.

FIG. 2 is an end elevation sectional view of a process chamber of the disk sputtering system, and is taken along section line 2—2 in FIG. 1.

FIG. 3 is an exploded perspective view of a shuttle including two alternative disk cradles.

FIG. 4 is an end elevation sectional view of the shuttle of FIG. 3, and is taken along section line 4—4 in FIG. 1.

FIG. 5 is a top plan view, partially in section, of an entrance station of the disk sputtering system of FIG. 1.

FIG. 6 is a side elevation view, partially in section, of the entrance station of FIG. 5.

FIG. 7 is a top plan view, partially in section, of an exit station of the disk sputtering system of FIG. 1.

FIG. 8 is a side elevation view, partially in section, of the exit station of FIG. 7.

FIG. 9 is a side elevation detail view of a shuttle grasping mechanism utilized in the exit station of FIG. 7.

FIGS. 10A, 10B, and 10C are side elevation detail views, as viewed from the back of the disk sputtering system, showing the relative positions of a shuttle during three stages of operation of a shuttle advance mechanism.

FIG. 11 is a block diagram of a control system utilized in the disk sputtering system.

FIG. 12 is an end elevation sectional view of an alternative embodiment of a shuttle adapted for carrying two back-to-back semiconductor wafers.

FIG. 13 is an end elevation sectional view of an alternative embodiment of the disk sputtering system that includes a disk rotation mechanism.

FIG. 14 is a side elevation sectional detail view of a portion of the shuttle and rail, and is taken along section line 14—14 in FIG. 13.

DETAILED DESCRIPTION OF THE PREFERRED EMBODIMENT

FIGS. 1 through 14 of the drawings depict various preferred embodiments of the present invention for purposes of illustration only. One skilled in the art will readily recognize from the following discussion that alternative embodiments of the structures and methods illustrated herein may be employed without departing from the principles of the invention described herein.

The preferred embodiment of the present invention is a step-dwell transport apparatus and method for use in an in-line disk sputtering system 10, shown in FIG. 1.

The sputtering system 10 consists of four stationary components, a process chamber 12, an entrance station 14, an exit station 16, and a return rail 18, plus a plurality of moveable shuttles 20 that are periodically cycled through the sputtering system. The sputtering system 10 is supported by a support structure (not shown) at a convenient working height. The shuttles 20 are cycled through the sputtering system 10 in a step-dwell motion by an entrance transfer and feed mechanism 22 and an exit transfer and extraction mechanism 24. The shuttles 20 carry disks 26 or other planar objects through the process chamber 12, where processing operations such as sputtering are performed, and carry the disks along the return rail 18 where processed disks 28 are unloaded from shuttles emerging from the process chamber and unprocessed disks 30 are loaded onto shuttles proceeding into the process chamber.

In the illustrated embodiment, the process chamber 12 comprises six processing stations 32 arranged horizontally. The pressure and composition of the gaseous atmosphere within the process chamber is controlled by vacuum pumps and a gas back-fill apparatus (not shown). Preferably, the processing stations are equally spaced apart by a distance equal to the length of the shuttle 20. The first two processing stations are housed in a double station module 34, while the last four processing stations are housed in a quadruple station module 36. The shuttles 20 are transported through the interior of the process chamber 12 along direction 38 and are guided by a process rail 40, shown in FIG. 2. The process rail 40 extends horizontally through the lower portion of the process chamber 12, and is supported from the floor of the process chamber 12 by a support structure 42. The process rail 40 is preferably a continuous rail that extends through the length of the process chamber 12. Alternatively, the process rail 40 can be partitioned into segments, with the gaps between the segments being short enough so that the shuttles can bridge the gaps as the shuttles proceed through the process chamber.

At each processing station 32, there are two ports 44 in the side walls of the process chamber 12. Each port 44 is either covered by a cover plate 46, or contains means for performing a processing operation such as sputtering. FIG. 2 shows two sputtering sources 48 installed in mounting plates 50 and projecting inward through the ports 44 and into the interior of the process chamber 12. The cover plates 46 or the mounting plates 50 are held in place by clamps 52, which facilitate the installation and removal of the sputtering sources. Sputter shields 53 are installed within the process chamber 12 above and below the sputtering sources 48 to collect sputtered particles in order to reduce particulate contamination of adjacent processing stations.

The primary purpose of the transport apparatus is to convey shuttles 20 loaded with disks 26 through the process chamber 12 in a step and dwell action. The entrance station 14, shown in FIG. 1, acts to transfer shuttles 20 from the return rail 18 to the process chamber 12. The entrance transfer and feed mechanism 22, which will be described in greater detail in conjunction with FIGS. 5 and 6, includes an entrance transfer rail 54 which receives a shuttle 20 from the return rail 18 and transfers the shuttle to a position in line with the process rail 40. When the shuttle 20 is aligned with the process rail 40, a first gate valve 56 opens, and a shuttle load cylinder 58 is actuated to load the shuttle into an entrance air lock or chamber 60. Then the first gate valve 56 is closed and the entrance air lock 60 is evacuated by a vacuum pump (not shown). After the entrance air lock 60 is evacuated to a pressure corresponding to the pressure within the process chamber 12, a second gate valve 62 opens to connect the entrance air lock to the process chamber. At the proper time, the shuttle 20 in the entrance air lock 60 is pushed into the process chamber 12 by activating a process queue advance cylinder 64.

The shuttles 20 within the process chamber 12 form a queue or train of abutting shuttles. In other words, the shuttles 20 positioned on the process rail 40 are touching front to back so that when a trailing one of the shuttles is pushed forward in direction 38 along the process rail 40, all of the shuttles move forward in unison. The action of loading a shuttle 20 into the entrance air lock 60 places the shuttle at a trailing position in the process queue. When the trailing shuttle is advanced from the entrance air lock 60 and into the process chamber, the trailing shuttle pushes the process queue of shuttles forward by a distance equal to the length of the shuttle. The action of advancing the trailing shuttle into the process chamber 12 advances each of the shuttles in the process queue to the next sequential processing station.

During the dwell portion of the step-dwell cycle, the shuttles 20 and disks 26 are stationary, and while the disks are stationary, the sputtering and other processing operations are performed. During the sputtering operations, both sides of the disk 26 simultaneously receive a coating of sputtered material from the sputtering sources 48. The shuttle 20 preferably positions the disk 26 at a position that is concentric to the ports 44 and the sputtering sources 48.

After the processing operations are completed, another shuttle 20 is transferred through the entrance air lock 60 to the trailing end of the process queue, and the process queue is once again advanced to reposition the shuttles at the next sequential processing stations. By the time a shuttle 20 comes to the leading position in the process queue, the shuttle 20 is positioned at the last processing station. Once the processing at this station has been performed, the disk 26 has been subjected to all of the processing operations. Upon the next advancement of the process queue, the leading shuttle of the queue is ejected from the process chamber 12 through an open third gate valve 66 and into an exit air lock or chamber 68. A shuttle advance mechanism 176, described below, pulls the leading shuttle completely into the exit air lock to provide clearance for the third gate valve 66 to close. Once the shuttle is positioned within the exit air lock 68, the third gate valve 66 is closed to isolate the exit air lock from the process chamber 12, and the exit air lock is vented to atmosphere. Then, a fourth gate valve 70 is opened, and the shuttle is extracted from the exit air lock by the exit transfer and extraction mechanism 24, which will be described in greater detail in conjunction with FIGS. 7 and 8. The exit transfer and extraction mechanism 24 extracts the shuttle from the exit air lock 68 and transfers the shuttle 20 to the position shown at 72 in FIG. 1 in line with the return rail 18. At the proper time, a return queue advance cylinder 74 is actuated, and a bar 76 that is coupled to the piston of the return queue advance cylinder 74 pushes the shuttle 72 onto the return rail 18 in direction 78. This motion of shuttle 72 advances the entire return queue of shuttles, and pushes the leading shuttle in the return queue onto the entrance transfer rail 54 for subsequent loading into the process chamber.

The transport apparatus thus provides continuous recycling of the shuttles 20 through the process and return queues, which permits the continuous throughput of disks through the process chamber 12. Such continuous throughput of disks through the process chamber is advantageous in that the processing operations reach an equilibrium state of performance, so that a high degree of consistency of processing is achieved.

In the preferred embodiment of the sputtering system 10, a series of five sputtering depositions occur. At the first processing station 32, the disk is radiantly heated by radiant heaters (not shown) installed through the ports 44 of the first processing station. At the second and third processing stations, undercoat layers are sputtered onto the disks 26. At the fourth processing station, a layer of magnetic material is sputtered onto the disks. The fifth and sixth processing stations apply overcoat layers to the disks. While the listed processing operations are preferred, other operations and other sequences could also be accommodated. For example, one or more of the processing operations could consist of sputter etching. In general, the processing operations include a broad range of heating, cleaning, deposition, and removal operations performed on planar objects in a controlled environment. Note that planar objects other than disks can be processed, such as semiconductor wafers, masks, and flat panel displays.

The modular grouping of the processing stations enables the sputtering system 10 to readily be expanded or contracted in size. If, for example, two additional processing stations 32 are desired, another double station module 34 can be installed to add two processing stations to the process chamber. When the process chamber is thus lengthened, the return rail 18 must also be lengthened. Note that the entrance and exit stations 14 and 16 are not affected by such a change. The process rail 40 and the return rail 18 need not be continuous, as long as any gaps can be bridged by the shuttles. In certain instances, it may be desirable to partition the process rail 40 into electrically isolated segments by leaving gaps between adjacent rail segments. Such isolation of the process rail may be required, for example, in order to apply a voltage to the disks 26 at one of the processing stations.

The shuttle 20 is shown in FIGS. 3 and 4 to consist of a rail coupling portion 80 that rides on the process rail 40 and the return rail 18, and a disk support portion 82 that supports a disk 26. The rail coupling portion 80 is preferably composed of two sheet metal sides 84 that are spaced apart and joined by three spacers 86. A chamfered finger 88 extends upward past the top of the sides 84 at each end of the shuttle. A bumper 90 extends outward from the fore and aft ends of the shuttle, and contacts other such bumpers attached to adjacently positioned shuttles. If the shuttles are to be electrically insulated from each other, the bumper 90 is formed of an insulative material. Two slots 92 and 94 open downward at one end of the shuttle for coupling with a shuttle advance mechanism (shown in FIGS. 7 and 10A–10C). Preferably, the slots 92 and 94 are contained on opposite sides at each end of the shuttle 20 for symmetry. The lower edges 95 of the metal sides 84 are crimped inward to wrap around the lower part of the rails to prevent the shuttles from lifting upward off of the rails. Four rollers 96 are disposed between the metal sides 84 and act to support the shuttle on top of the rails. The rail coupling portion also includes a vertically elongated slot 98. Preferably, both sides 84 of the rail coupling portion 80 contain the slots 92, 94, and 98, so that the shuttle 20 is symmetrical and can be loaded onto the rails without regard to orientation. As shown in FIG. 4, the rail coupling portion 80 of the shuttle 20 substantially surrounds the process rail 40. This feature prevents sputtering particles from accumulating on the process rail to eliminate a potential source of contaminants and to prevent seizing of the shuttles on the rail. If particles were allowed to accumulate on the process rail 40, the movement of the shuttles 20 along the rail could cause some of the particles to later flake off and contaminate the sputtering process. Since the shuttle 20 substantially encloses the process rail 40, particles accumulate on the shuttles, not the rail.

The disk support portion 82 of the shuttle 20 includes a cradle 100 that supports a disk or other planar object, and a base 102 that joins with the rail coupling portion 80 of the shuttle. The base 102 includes three slots 104 that cooperate with the spacers 86 to position the disk support portion. As shown in FIG. 4, the cradle 100 has a circumferentially extending vee shaped groove 106 that supports the disk 26. The shape of the groove 106 accommodates thermal expansion and contraction of the disk. The outer edges of the groove 106 are relieved to minimize the shadowing effect of the cradle on the edge of the disk. The cradle 100 extends somewhat less than a half circle to facilitate loading and unloading of the disks 26.

An alternative disk support portion 108, shown in FIG. 3, has a cradle 110 that can accommodate three disks of a smaller diameter. The disk support portion 108 includes three slots 112 for coupling the disk support to the rail coupling portion 80. The disk support portions 82 and 108 can be easily removed from the rail coupling portion and interchanged to provide flexibility in processing different sized disks and numbers of disks. Removal of the disk support portion also facilitates the cleaning of the shuttle 20 to remove sputtered particles. Also, the cradles of the disk support portions can be fabricated in different shapes to accommodate non-circular planar objects.

Also shown in FIG. 3 are two segments 40a and 40b of the process rail 40. If the shuttle 20 needs to be electrically isolated from adjacent shuttles, then the process rail 40 is segmented so that the shuttles are not electrically coupled through the rail. Thus, a shuttle positioned on rail segment 40a is electrically isolated from a shuttle positioned on rail segment 40b. A tapered lead-in 114 is provided at the leading edge of segment 40b to facilitate the transfer of the shuttle between the two segments.

The entrance transfer and feed mechanism 22, as illustrated in FIGS. 5 and 6, acts to transfer shuttles 20 from the return rail 18 to the process rail 40. More particularly, the entrance transfer and feed mechanism 22 performs three functions: (1) transferring a shuttle 20 on the entrance transfer rail 54 from a position aligned with the return rail 18 to a position aligned with the process rail 40, (2) loading the shuttle through the open first gate valve 56 and into the entrance air lock 60, and (3) advancing the shuttle into the process chamber through the open second gate valve 62 to advance the process queue of shuttles.

Function (1) is accomplished by periodically extending the entrance transfer rail 54 to a position in line with the return rail 18, as shown in FIG. 1, and, after a shuttle is pushed onto the entrance transfer rail, by retracting the entrance transfer rail to a position in line with the process rail 40, as shown in FIG. 5. The entrance transfer rail 54 is mounted to a rail support 120, which is in turn supported by rollers 122 that ride on the top of a base plate 124. An entrance transfer cylinder 126, mounted to the top of the base plate 124, is coupled to the rail support 120 and extends and retracts the entrance transfer rail 54 at the proper times. Two guide rails 128 flank the entrance transfer rail 54 and ensure that the shuttle 20 remains in its proper position on the entrance transfer rail. Preferably, all of the cylinders of the transport apparatus are rodless pneumatic cylinders, which are preferred over conventional pneumatic cylinders in the interests of saving space.

Function (2) is accomplished by periodically actuating the shuttle load cylinder 58 to push the shuttle 20 from the entrance transfer rail 54 and onto an entrance air lock rail 130 positioned within the entrance air lock 60. The piston of the shuttle load cylinder 58 is coupled to a slide 132 that includes a protruding tongue 134. When the shuttle load cylinder 58 is retracted, as shown in FIG. 6, the tongue 134 clears the aft end of the shuttle 20. After the gate 136 of the first gate valve 56 is opened, the shuttle load cylinder 58 is actuated, which displaces the slide 132 toward the entrance air lock 60. The tongue 134 contacts the aft end of the shuttle 20 and propels it onto the entrance air lock rail 130. When the shuttle load cylinder 58 is fully extended, as shown in FIG. 5, the tongue 134 protrudes through the open first gate valve 56 and into the entrance air lock to ensure that the shuttle clears the gate 136 of the first gate valve. Note that the leading edge of the entrance air lock rail 130 is tapered to facilitate the transfer of the shuttle between rails. After the shuttle 20 has been loaded into the entrance air lock 60, the shuttle load cylinder retracts to the position shown in FIG. 6.

Function (3) is accomplished by a process queue advance mechanism by periodically actuating the process queue advance cylinder 64 to push the shuttle 20 from the entrance air lock rail 130 and onto the process rail 40. A rod 140 is coupled for movement with the piston of the process queue advance cylinder through a rod holder 142. The forward end of the rod 140 extends through a pressure seal and linear bearing 143 and into the entrance air lock 60. One pin 144 extends laterally from the forward end of the rod 140, while another pin 146 extends laterally from the aft end of the rod. A holder 148 and rotary cylinder 150 provide means for rotating the rod 140 by a quarter turn. The rotary cylinder is mounted to a bracket 152, and is coupled to the holder 148. The holder has a vee shaped slot 154 that accepts the aft pin 146 when the rod 140 is retracted. When the rod 140 and the process queue advance cylinder 64 are retracted, as shown in FIG. 6, the forward pin 144 points downward to provide clearance for the loading of a shuttle 20 into the entrance air lock 60. After a shuttle is loaded into the entrance air lock, the rotary cylinder 150 rotates the holder 148 and the rod 140 by a quarter turn to bring the forward pin 144 to a position behind the shuttle. Then, the process queue advance cylinder 64 is actuated to extend the rod 140, which pushes the shuttle through the open gate 156 of the second gate valve 62 and onto the process rail 40 (shown in FIG. 5), which also advances the process queue of shuttles within the process chamber 12. Thereafter, the process queue advance cylinder 64 is retracted and the aft pin 146 engages the holder 148. The rotary cylinder 150 then rotates the rod 140 back to the clearance position shown in FIG. 6.

The process queue advance mechanism is particularly advantageous in that it is located outside of the process chamber, so that particulate generation within the process chamber is minimized. Also, the process queue advance mechanism is advantageous as compared to the Gartek system in that it permits the continuous recycling of shuttles rather than batch operation. Continuous recycling of shuttles is made possible by the use of the pass through entrance air lock 60. The laterally offset placement of the process queue advance mechanism allows the use of an air lock having in line gate valves, which minimizes the internal volume of the air lock and, thus, minimizes the time to evacuate the air lock.

Also shown in FIG. 5 is an optical disk detect sensor 158, which detects the presence of a disk on a shuttle loaded in the entrance air lock 60. The disk detect sensor 158 includes a light source 160 and a detector 162, mounted on opposite sides of the entrance air lock. Light emitted by the light source passes through two ports 164 to the detector if there is no disk 26 mounted on the shuttle in the entrance air lock, otherwise, the light is blocked. The sputtering system control system, as described below, selectively inhibits the performance of the processing operations when shuttles without disks enter the process chamber 12.

The exit transfer and extraction mechanism 24, as illustrated in FIGS. 7 and 8, acts to transfer shuttles 20 from the process rail 40 to the return rail 18. More particularly, the exit transfer and extraction mechanism 24 performs three functions: [1] moving the leading shuttle fully into the exit air lock 68 from the process chamber 12 to provide clearance for the third gate valve 66 to close, [2] extracting the shuttle through the open fourth gate valve 70 and onto an exit transfer rail 170, and [3] transferring the shuttle on the exit transfer rail 170 from a position aligned with the process rail 40 to a position aligned with the return rail 18.

After a shuttle 20 has traveled the length of the process chamber 12, it is ejected onto an exit air lock rail 172 in the exit air lock 68. However, since the shuttle is pushed only partially into the exit air lock by the process queue, the shuttle must be drawn further into the exit air lock to provide clearance for the gate 174 of the third gate valve 66 to close. A shuttle advance mechanism 176, illustrated in FIGS. 7 and 10, is a geneva crank mechanism that engages the slots 92 and 94 on the rail coupling portion 80 of the shuttle 20 to move the shuttle 20 completely into the exit air lock 68. The shuttle advance mechanism 176 consists of a rotary motor 178 positioned outside the process chamber 12, a shaft 180 coupled to the motor and extending through the wall of the process chamber, a crank 182 coupled to the opposite end of the shaft, and a roller 184 carried at the free end of the crank. The rotary motor 178 is capable of positioning and rotating the crank 182.

When the leading shuttle 20 is ejected into the exit air lock, the crank 182 is positioned as shown in FIG. 10A, pointing toward the oncoming shuttle, which moves along direction 38. Note that FIG. 10 is oriented as viewed from the rear of the sputtering system 10. The leading edge of the shuttle side 84 is relieved to provide clearance for the shaft 180, crank 182, and roller 184. The advancement of the process queue of abutting shuttles ejects the leading shuttle partially into the exit air lock 68, with the shuttle coming to rest with the slot 92 located just above the roller 184. The crank and roller prevent the shuttle from moving too far forward. The rotary motor 178 then rotates the shaft 180 and crank 182 by a half revolution, which causes the roller 184 to engage the slot 92 and move the shuttle to the position shown in FIG. 10B. The roller 184 then disengages from the slot 92 and the shaft and crank continue to rotate another half revolution, whereupon the roller engages slot 94. Continued rotation by a half revolution of the shaft and crank to position 186 moves the shuttle to the position shown in FIG. 10C, thereby providing clearance for the third gate valve to close. The crank 182 remains at position 186 and locks the shuttle 20 in place while a pawl 194 is inserted into the exit air lock 68 and latches behind the chamfered finger 88 at the leading end of the shuttle. After the pawl 194 has grasped the shuttle, the rotary motor 178 rotates the shaft 180 until the crank 182 comes to rest at the clearance position 188 shown in FIG. 10C. After the shuttle is extracted from the exit air lock, the crank is rotated to the position shown in FIG. 10A in preparation for the next shuttle. The shuttle advance mechanism 176 thus advances the shuttle 20 by a distance about equal to twice the spacing of the slots 92 and 94, which is sufficient for the shuttle to clear the third gate valve 66.

Function [2] of the exit transfer and extraction mechanism 24 is accomplished by periodically actuating a shuttle extraction cylinder 190 to pull the shuttle 20 from the exit air lock rail 172 and onto the exit transfer rail 170. The piston of the shuttle extraction cylinder 190 is coupled to a slide 192 that includes the grasping pawl 194 positioned at the end of a protruding tongue 196. As shown in FIG. 9, the pawl 194 is pivotably connected to the end of the tongue 196, with the exact position of the pawl being adjustable by a screw 198. After the gate 200 of the fourth gate valve 70 is opened, the shuttle extraction cylinder 190 is extended, which displaces the slide 192 toward the exit air lock 68. As the shuttle extraction cylinder 190 extends, the tongue 196 protrudes through the open fourth gate valve 70 and into the exit air lock. When the chamfered edge of the pawl 194 strikes the chamfered finger 88 of the shuttle, the pawl flips upward. Once the pawl is clear of the finger 88, it pivots downward into an opening between the finger and the end of the disk support 82. After the crank 182 rotates to position 188, the shuttle extraction cylinder 190 retracts and the pawl 194 pulls the shuttle out of the exit air lock and onto the exit transfer rail 170. After the shuttle is removed from the exit air lock 68, the fourth gate valve 70 is closed and the exit air lock is evacuated by a vacuum pump (not shown) in preparation for receiving the next shuttle from the process chamber.

Function [3] of the exit transfer and extraction mechanism is accomplished by periodically retracting the exit transfer rail 170 to a position in line with the process rail 40, as shown in FIG. 7, and, after a shuttle in pulled onto the exit transfer rail, by extending the exit transfer rail to a position in line with the return rail 18, as shown in FIG. 1. In so extending the exit transfer rail 170, the shuttle moves laterally out of the grasp of the pawl 194. The exit transfer rail 170 is mounted to a rail support 202, which is in turn supported by rollers 204 that ride on the top of a base plate 206. An exit transfer cylinder 208. mounted to the base plate 206, is coupled to the rail support 202 and extends and retracts the exit transfer rail 170 at the proper times. Two guide rails 210 flank the exit transfer rail 170 and ensure that the shuttle 20 remains in its proper position on the exit transfer rail.

The entrance and exit air locks 60 and 68 are sized so that a minimal amount of gas need be evacuated from or vented into the air locks in order to speed the processing of disks. The scales of FIGS. 5, 6, 7, and 8 are exaggerated for clarity.

A control system for the transport apparatus is illustrated in block form in FIG. 11. A controller 212, which is preferably a computer, issues a series of control signals to the various cylinders to control the operation of the transport apparatus. Both the entrance transfer cylinder 54 and the exit transfer cylinder 208 are monitored by extend and retract sensors 214 and 216 so that no shuttle movement occurs unless the transfer rails are in the correct locations. In addition to controlling the operation of the transport apparatus, the controller 212 may also be used to control the overall operation of the sputtering system 10.

In summary, the process of transporting shuttles through the process chamber 12 comprises the following steps, beginning with the entrance air lock 60 and the exit air lock 68 at atmospheric pressure and a shuttle 20 with a disk 26 waiting outside the entrance air lock: (1) the first gate valve 56 and the fourth gate valve 70 open; (2) the shuttle load cylinder 58 pushes the shuttle into the entrance air lock from the entrance transfer rail 54, and the shuttle extraction cylinder 190 pulls a shuttle onto the exit transfer rail 170 from the exit air lock; (3) the first and fourth gate valves close; (4) the entrance and exit air locks are pumped down; (5) the processing operations are performed on the disks located within the process chamber 12; (6) the second gate valve 62 and the third gate valve 66 open; (7) the process queue advance cylinder 64 pushes the trailing shuttle from the entrance air lock into the process chamber, which causes all of the shuttles within the process chamber to advance to the next processing station and the leading shuttle to be pushed partially into the exit air lock; (8) the rod 140 is retracted by the process queue advance cylinder and rotated one quarter turn by the rotary cylinder 150, and the shuttle advance mechanism 176 pulls the leading shuttle fully into the exit air lock; (9) the second and third gate valves close; (10) the entrance and exit air locks are vented to atmosphere, and (11) the cycle is repeated.

The process of recycling the shuttles occurs after step (2) is complete and before the next succeeding step (2) is executed. The recycling process includes the steps of: [1] extending the entrance and exit transfer cylinders to position the entrance and exit transfer rails in line with the return rail 18; [2] the return queue advance cylinder 74 pushes a shuttle off of the exit transfer rail and onto the return rail, which causes all of the shuttles on the return rail to advance and the leading shuttle to be pushed onto the entrance transfer rail; and [3] retracting the entrance and exit transfer cylinders to position the entrance and exit transfer rails in line with the process rail 40.

An alternative embodiment of a shuttle 220, shown in FIG. 12, is adapted for carrying two back-to-back planar objects 222 through the process chamber 12, with the processing operation occurring on only one surface of each object. The objects 222 could be, for example, semiconductor wafers, with the processing operations used for depositing a metalization layer onto the component sides of the wafers.

An alternative embodiment of a processing station, shown in FIGS. 13 and 14, allows for the sputtering of one side of a disk 230 while the disk is being rotated by a disk rotation mechanism 232 to provide still better uniformity in sputtered magnetic layers. The disk rotation mechanism 232 includes a retractable chuck 234 with three arms 236 for grasping the disk, means (not shown) for pivoting the chuck and disk, a bellows seal 238 for sealing the disk rotation mechanism while allowing for pivoting movement, and a rotary motor 240 for rotating the disk. When the chuck is extended, the arms are inserted into the center hole of a disk and are then expanded radially outward to grasp the disk. The chuck and disk are then pivoted upward to disengage the disk from its cradle 100 and the disk is rotated by the motor, during which time the sputtering operation is performed. After the sputtering operation is complete, the rotation stops and the chuck 234 is pivoted downward to place the disk back into its cradle. The arms 236 and the chuck 234 then retract to provide clearance for the shuttle to move to the next station, where another disk rotation mechanism rotates the disk during sputtering of the other side of the disk.

In order to properly align the disk and shuttle with the disk rotation mechanism, a tapered pin 242 is extended through the vertically elongated slot 98 by a drive mechanism 246 and into a mating hole 244 in the process rail 40. The tapered pin 242 aligns the slot 98 with the hole 244 to provide consistent positioning of the shuttle. The tapered pin 242 is withdrawn after the disk is replaced on the cradle to allow the shuttle to advance.

From the above description, it will be apparent that the invention disclosed herein provides a novel and advantageous step-dwell transport apparatus and method for use in an in-line sputtering system. The foregoing discussion discloses and describes merely exemplary methods and embodiments of the present invention. One skilled in the art will readily recognize from such discussion that various changes, modifications and variations may be made therein without departing from the spirit and scope of the invention described in the following claims. For example, the processing stations could be spaced apart by distances equal to multiples of the shuttle length instead of a distance equal to the shuttle length. Accordingly, the disclosure of the present invention is intended to be illustrative, but not limiting, of the scope of the invention, which is set forth in the following claims.

What is claimed is:

1. A transport apparatus for intermittently conveying planar objects through a process chamber and past one or more processing stations each capable of performing a processing operation upon the planar objects, wherein said process chamber and said processing stations are operable for depositing material onto the planar objects by sputtering material deposition operations, said apparatus comprising:

a stationary first rail extending through the process chamber and past each of said processing stations, wherein at least one of the processing stations is capable of performing a sputtering material deposition operation upon a planar object positioned adjacent thereto;

a plurality of shuttles engaging only said first rail from a position above said first rail and forming a first queue of abutting shuttles extending along said first rail, each of said shuttles being operable for sequentially positioning a planar object adjacent to each of said processing stations, said shuttles being guided through the process chamber solely by said first rail, each of said shuttles substantially enclosing said first rail to prevent the accumulation on said first rail of particulates generated by the material deposition operation; and means for periodically advancing said first queue of abutting shuttles along said first rail by advancing a trailing one of said shuttles.

2. The apparatus as recited in claim 1 wherein said first rail has a substantially rectangular cross-section, wherein each of said shuttles includes a rails coupling portion that extends over and engages the top and sides of said first rail and an object support portion adapted for supporting one or more planar objects above said first rail, and wherein said rail coupling portion of said shuttles covers the top and sides of said first rail to shield said first rail from the deposit of particulates generated by the material deposition operation.

3. The apparatus as recited in claim 2 wherein said object support portion of said shuttle is removable from said rail coupling portion and includes a cradle for supporting the planar object by engaging a lower edge thereof, said cradle allows loading of the planar object onto said shuttle by lowering the planar object into said cradle and allows unloading of the planar object from said shuttle by raising the planar object from said cradle.

4. The apparatus as recited in claim 2 wherein said rail coupling portion of said shuttle includes rollers that ride on the top of said first rail to vertically support said shuttle, and includes sides that flank the sides of said first rail with lower edges thereof that are crimped inward below the bottom of said first rail to prevent said shuttle from lifting upward from said first rail.

5. The apparatus as recited in claim 2 further comprising isolating means for electrically isolating adjacent shuttles within said first queue of abutting shuttles, and wherein said first rail is partitioned into electrically isolated segments to permit the creation of electrical potentials between adjacent shuttles.

6. The apparatus as recited in claim 1 wherein said means for periodically advancing said first queue of abutting shuttles includes displacement means for advancing said trailing one of said shuttles, and includes control means for activating the processing operations when the shuttles are stationary and for activating said displacement means after the processing operations are completed.

7. The apparatus as recited in claim 6 wherein said control means includes sensor means for detecting the presence of planar objects carried by said shuttles, and includes means for inhibiting the performance of a processing operation when the shuttle adjacent a processing station carries no planar object.

8. The apparatus as recited in claim 1 further comprising means for recirculating said shuttles from an exit end of said first rail to an entrance end of said first rail, wherein said means includes:

a second rail carrying a second queue of abutting shuttles;

an exit station coupled between said exit end of said first rail and an entrance end of said second rail for transferring shuttles carrying processed planar objects from said first rail to said second rail;

an entrance station coupled between an exit end of said second rail and said entrance end of said first rail for transferring shuttles carrying pre-processed planar objects from said second rail to said first rail; and means for periodically advancing said second queue of abutting shuttles along said second rail;

said second rail defining an area for unloading processed planar objects from said shuttles and for loading pre-processed planar objects onto said shuttles.

9. An apparatus for performing a sequence of processing operations including sputtering material deposition operations upon planar objects, said apparatus comprising:

a process chamber having porcessing stations each capable of performing a processing operation upon an adjacently positioned planar object, wherein at least one of the processing stations is capable of performing a sputtering material deposition operation upon a planar object positioned adjacent thereto;

a stationary first rail extending through said process chamber and past each of said processing stations;

a plurality of shuttles engaging only said first rail from above and forming a first queue of abutting shuttles extending through said process chamber, each of said shuttles being operable for carrying a planar object through said process chamber and for sequentially positioning the planar object with respect to each processing station, said shuttles being guided solely by said first rail, each of said shuttles substantially enclosing said first rail to prevent the accumulation on said first rail of particulates generated by the material deposition operation, wherein said processing stations are spaced apart by a distance equal to an integer multiple of the length of said shuttle;

displacement means for periodically advancing said first queue of abutting shuttles by a distance equal to the length of said shuttle by advancing a trailing one of said shuttles in order to reposition a shuttle adjacent to each of said processing stations; and control means for alternately activating said processing operations when said shuttles are stationary and activating said displacement means after said processing operations are completed.

10. The apparatus as recited in claim 9 wherein the interior of said process chamber is sealed from the external atmosphere, wherein said apparatus further comprises an entrance air lock through which shuttles carrying pre-processed planar objects enter said process chamber and an exit air lock through which shuttles carrying processed planar objects exit said process chamber, and wherein said shuttles enter and exit said air locks in a direction in line with said first rail.

11. The apparatus as recited in claim 10 wherein said entrance air lock includes a first gate valve that when open permits shuttles to enter said entrance air lock in line with said first rail and when closed seals said entrance air lock from the external atmosphere, and includes a second gate valve that when open permits shuttles to exit said entrance air lock in line with said first rail into said process chamber and when closed seals said entrance air lock from said process chamber, and wherein said apparatus further comprises means for transferring said shuttles into said entrance air lock in line with said first rail when said first gate valve is open and said second gate valve is closed.

12. The apparatus as recited in claim 11 wherein said entrance air lock includes an entrance rail disposed between said first and second gate valves and aligned with said first rail, and wherein said means for transferring said shuttles into said entrance air lock includes means for advancing one of said shuttles past said first gate valve and onto said entrance rail.

13. The apparatus as recited in claim 12 wherein said displacement means is operable for periodically advancing said first queue of abutting shuttles by advancing a shuttle from said entrance rail to said first rail when said first gate valve is closed and said second gate valve is open.

14. The apparatus as recited in claim 13 wherein said displacement means includes a rod that extends into said entrance air lock and is coupled to motive means located outside of said entrance air lock, said motive means being operable for positioning said rod at a clearance position to allow said shuttle to be loaded into said entrance air lock, for rotating said rod to a position for coupling said rod to said shuttle, for extending said rod to advance said shuttle into said process chamber, and for retracting said rod to said clearance position.

15. The apparatus as recited in claim 10 further comprising means for recirculating said shuttles from an exit end of said exit air lock to an entrance end of said entrance air lock, wherein said means includes:
a second rail carrying a second queue of abutting shuttles;
an exit station coupled between said exit end of said exit air lock and an entrance end of said second rail for transferring shuttles carrying processed planar objects from said exit air lock to said second rail;
an entrance station coupled between an exit end of said second rail and said entrance end of said entrance air lock for transferring shuttles carrying pre-processed planar objects from said second rail to said entrance air lock; and
means for periodically advancing said second queue of abutting shuttles along said second rail;
said second rail defining an area for unloading processed planar objects from said shuttles emerging from said process chamber and for loading pre-processed planar objects onto said shuttles proceeding into said process chamber.

16. The apparatus as recited in claim 10 wherein said first rail has a substantially rectangular cross-section, wherein each of said shuttles includes a rail coupling portion that extends over and engages the top and sides of said first rail and an object support portion adapted for supporting one or more planar objects above said first rail, and wherein said rail coupling portion of said shuttles covers the top and sides of said first rail to shield said first rail from the deposit of particulates generated by the material deposition operation.

17. The apparatus as recited in claim 16 wherein said object support portion of said shuttle is removable from said rail coupling portion and includes a cradle for supporting the planar object by engaging a lower edge thereof, said cradle allows loading of the planar object onto said shuttle by lowering the planar object into said cradle and allows unloading of the planar object from said shuttle by raising the planar object from said cradle.

18. The apparatus as recited in claim 10 further comprising isolating means for electrically isolating adjacent shuttles within said first queue of abutting shuttles, and wherein said first rail is partitioned into electrically isolated segments to permit the creation of electrical potentials between adjacent shuttles.

19. The apparatus as recited in claim 10 wherein said exit air lock includes a third gate valve that when open permits shuttles to enter said exit air lock from said process chamber in line with said first rail and when closed seals said entrance air lock from said process chamber, and includes a fourth gate valve that when open permits shuttles to exit said exit air lock in line with said first rail and when closed seals said exit air lock from the external atmosphere, and wherein said apparatus further comprising means for removing said shuttles from said exit air lock when said third gate valve is closed and said fourth gate valve is open.

20. The apparatus as recited in claim 19 wherein said exit air lock includes an exit rail disposed between said third and fourth gate valves and aligned with said first rail, wherein a leading shuttle of said queue of abutting shuttles is transferred partially onto said exit rail by the action of said displacement means advancing said first queue of abutting shuttles when said third gate valve is open and said fourth gate valve is closed, and wherein said apparatus further comprises means for advancing said leading shuttle further into said exit air lock to provide clearance for closure of said third gate valve.

21. The apparatus as recited in claim 20 and wherein said means for advancing said leading shuttle further into said exit air lock includes a geneva crank mechanism that engages one or more slots in said shuttle.

22. The apparatus as recited in claim 9 wherein said control means includes sensor means for detecting the presence of planar objects carried by said shuttles, and includes means for inhibiting the performance of a processing operation when the shuttle adjacent a processing station carries no planar object.

23. An apparatus for performing a sequence of processing operations upon disk-shaped objects, including sputtering material deposition operations, said apparatus comprising:
a process chamber having processing stations each capable of performing a processing operation upon an adjacently positioned disk-shaped object, wherein at least one of said processing stations is capable of performing a sputtering material deposition operation upon a disk-shaped object positioned adjacent thereto;
a stationary first rail extending through said process chamber and past each of said processing stations;
a plurality of shuttles engaging said only first rail from above and forming a first queue of abutting shuttles extending through said process chamber, each of said shuttles having a cradle adapted for carrying one of the disk-shaped objects, each of said shuttles being operable for carrying a disk-shaped object through said process chamber and for sequentially positioning the disk-shaped object with respect to each processing station, said shuttles being guided solely by said first rail, each of said shuttles substantially enclosing said first rail to prevent the accumulation on said first rail of particulates generated by the material deposition operation, wherein each of said shuttles includes rollers that ride on the top of said first rail to vertically support said shuttle and includes sides that flank the sides of said first rail with lower edges thereof that are crimped inward below the bottom of said first rail to prevent said shuttle from lifting upward, and wherein said processing stations are spaced apart by a distance equal to an integer multiple of the length of said shuttle;
an entrance chamber coupled to said process chamber through which shuttles carrying disk-shaped objects to be processed enter said process chamber in line with said first rail;

means for transferring said shuttles into said entrance chamber and onto an entrance rail disposed within said entrance chamber and aligned with said first rail;

an exit chamber coupled to said process chamber through which shuttles carrying processed disk-shaped objects exit said process chamber in line with said first rail, said exit chamber including an exit rail disposed therein and aligned with said first rail;

displacement means for periodically advancing said first queue of abutting shuttles by a distance equal to the length of said shuttle by advancing a trailing one of said shuttles in order to reposition a shuttle adjacent to each of said processing stations and to eject a leading one of said shuttles out of said process chamber an into said exit chamber;

means for removing said shuttles from said exit chamber in a direction in line with said first rail;

a second rail carrying a second queue of abutting shuttles, said second rail defining an area for unloading processed disk-shaped objects from said shuttles emerging from said process chamber and for loading disk-shaped objects to be processed onto said shuttles proceeding into said process chamber;

an exit station coupled between an exit end of said exit chamber and an entrance end of said second rail for transferring shuttles carrying processed disk-shaped objects from said exit chamber to said second rail;

an entrance station coupled between an exit end of said second rail and an entrance end of said entrance chamber for transferring shuttles carrying disk-shaped objects to be processed from said second rail to said entrance chamber;

means for periodically advancing said second queue of abutting shuttles along said second rail; and control means for alternately activating said processing operations when said shuttles are stationary and activating said displacement means after said processing operations are completed.

24. In a processing apparatus capable of depositing material on planar objects, wherein said processing apparatus includes a linearly-disposed process chamber having an entrance end and an exit end, includes airlock means disposed at the entrance and exit ends of the process chamber, includes one or more processing stations capable of performing various processing operations upon planar objects conveyed through the process chamber, wherein at least one processing station is capable of performing a sputtering material deposition operation, and includes transport means for conveying planar objects through the process chamber, wherein the improvement comprises a transport mechanism comprising:

a plurality of shuttles each operable for carrying a planar object;

a stationary guide rail extending linearly through the process chamber between the entrance and exit ends thereof, wherein said shuttles are disposed above said guide rail and are supported and guided solely by said guide rail, wherein said shuttles form a queue of abutting shuttles extending along said guide rail, wherein each of said shuttles substantially encloses said guide rail to prevent the acumulation on said guide rail of particulates generated by the sputtering material deposition oepration; and means for periodically advancing said queue of abutting shuttles along said guide rail by advancing a trailing one of said shuttles.

* * * * *